US008809080B2

(12) United States Patent
Lee et al.

(10) Patent No.: US 8,809,080 B2
(45) Date of Patent: Aug. 19, 2014

(54) ELECTRONIC ASSEMBLY

(71) Applicant: Intellectual Discovery Co., Ltd., Seoul (KR)

(72) Inventors: Meng Ee Lee, Bukit Mertajam (MY); Seong Choon Lim, Bayan Lepas (MY); Eng Chuan Ong, Bukit Mertajam (MY)

(73) Assignee: Intellectual Discovery Co., Ltd., Seoul (JP)

( * ) Notice: Subject to any disclaimer, the term of this patent is extended or adjusted under 35 U.S.C. 154(b) by 1 day.

(21) Appl. No.: 13/712,357

(22) Filed: Dec. 12, 2012

(65) Prior Publication Data

US 2013/0099269 A1  Apr. 25, 2013

Related U.S. Application Data

(63) Continuation of application No. 12/764,069, filed on Apr. 20, 2010, now Pat. No. 8,354,745.

(51) Int. Cl.
*H01L 21/00* (2006.01)
*H01L 33/00* (2010.01)
*H01L 33/52* (2010.01)
*H01L 33/48* (2010.01)
*H01L 33/60* (2010.01)
H01L 33/62 (2010.01)

(52) U.S. Cl.
CPC ....... *H01L 33/52* (2013.01); *H01L 2224/49109* (2013.01); *H01L 2224/48227* (2013.01); *H01L 33/62* (2013.01); *H01L 33/486* (2013.01); *H01L 33/48* (2013.01); *H01L 2224/73265* (2013.01); *H01L 33/60* (2013.01)
USPC ................. 438/22; 257/98; 257/99

(58) Field of Classification Search
CPC ....... H01L 33/486; H01L 33/60; H01L 33/48; H01L 33/52; H01L 33/62; H01L 2224/49109; H01L 2224/48227; H01L 2224/73265; H01L 2924/00
USPC ......... 257/98, 99, E33.058, E33.072; 438/22, 438/26, 27
See application file for complete search history.

(56) References Cited

U.S. PATENT DOCUMENTS

| 6,184,544 B1 * | 2/2001 | Toda et al. ..................... 257/98 |
| 6,707,069 B2 | 3/2004 | Song et al. |
| 7,576,366 B2 * | 8/2009 | Shen ............................... 257/98 |
| 2003/0032212 A1 * | 2/2003 | Wang et al. .................... 438/48 |
| 2004/0229391 A1 | 11/2004 | Ohya et al. |
| 2007/0007558 A1 | 1/2007 | Mazzochette |
| 2008/0025030 A9 | 1/2008 | Lee et al. |

FOREIGN PATENT DOCUMENTS

| JP | 2005086075 A | 3/2005 |
| JP | 2007165735 A | 6/2007 |
| JP | 2008218761 A | 9/2008 |

* cited by examiner

*Primary Examiner* — Nikolay Yushin
(74) *Attorney, Agent, or Firm* — Fox Rothschild LLP

(57) ABSTRACT

An electronic assembly includes a first substrate and a second substrate, a hole through the first substrate, the second substrate having a trace with an indentation, an electronic device mounted over the indentation in the trace, and the first substrate is attached to the second substrate such that the electronic device is positioned within the hole through the first substrate.

20 Claims, 4 Drawing Sheets

ELECTRONIC ASSEMBLY

This patent application is a continuation of U.S. patent application Ser. No. 12/764,069 filed Apr. 20, 2010.

Light emitting devices may emit light through multiple surfaces. In an assembled product, it is common to provide a reflecting cup to redirect light emitting from some surfaces toward a desired primary direction. It is also common to encapsulate the assembled product, and to form the encapsulation material into a lens to further direct the emitted light. The reflecting cup may, for example, be mechanically evacuated (for example, drilled) from a solid substrate and the entire surface of the reflecting cup may be plated with a reflective material (for example, with gold or silver). The light emitting device may then be mounted onto the plated cup by using an adhesive (for example, conductive silver epoxy or non-conductive clear epoxy or silicone).

DETAILED DESCRIPTION

The inventors have discovered that a light emitting device may not adhere well to the smooth flat plating material on a reflecting cup, so the assembly may be prone to de-lamination between the light emitting device and the plated reflecting cup. In addition, the encapsulation material may not adhere well to the plating material of the reflecting cup, and the assembly may be prone to delamination between the encapsulation material and the plated reflecting cup. Typically, the light emitting devices generate a substantial amount of heat, which further stresses bonding between the various materials. Each of these potential de-lamination possibilities affects product reliability. There is an ongoing need to improve reliability.

Figure 1A:
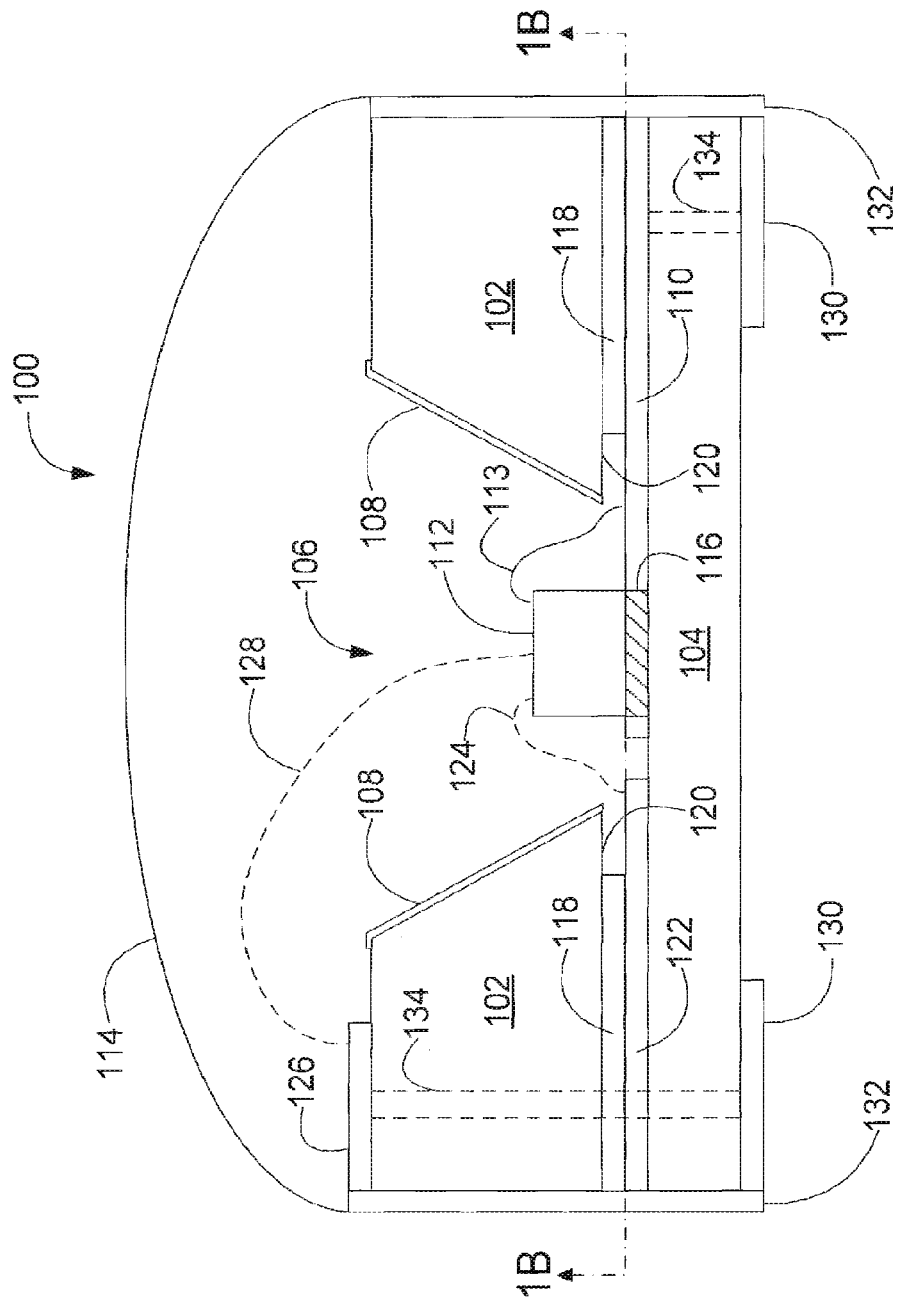
FIG. 1A is a cross-section side view illustrating an example embodiment of an electronic assembly.

FIG. 1A illustrates an example embodiment of an electronic assembly 100. In the illustrated assembly, there is a first substrate 102 and a second substrate 104. The substrates may be printed circuit board material (for example, FR4, or flexible printed circuit materials), or may be ceramic or other substrates suitable for electronic assemblies. The first substrate 102 has a cone shaped hole (106), forming an opening on each of two opposite sides of the first substrate. One opening is smaller than the other. The two substrates are attached so the smaller opening in the first substrate 102 is adjacent to the second substrate 104. The walls (108) of the hole are coated or plated with a reflective material (for example, gold or silver). The second substrate 104 has at least one conductive trace 110. A light emitting device 112 is attached to the trace 110 (for example, by conductive silver epoxy or non-conductive clear epoxy or silicone). The light emitting device 112 may be electrically connected to the trace 110, for example, by using a wire bond 113. The light emitting device 112 may be, for example, a semiconductor die including a Light Emitting Diode (LED). The light emitting device 112 may emit light from a top surface (as viewed in FIG. 1A), or side surfaces, or both. The light may be emitted over a wide angle. Some light from the light emitting device 112 passes directly through the hole 106 in the first substrate 102, and some light from the light emitting device 112 is reflected from the reflective walls 108 and then through the hole 106. The assembly is encapsulated by a transparent encapsulate 114, which may be, for example, epoxy or silicone. The surface of encapsulate 114 may be shaped to form a lens to further direct light from the light emitting device.

Figure 1B:
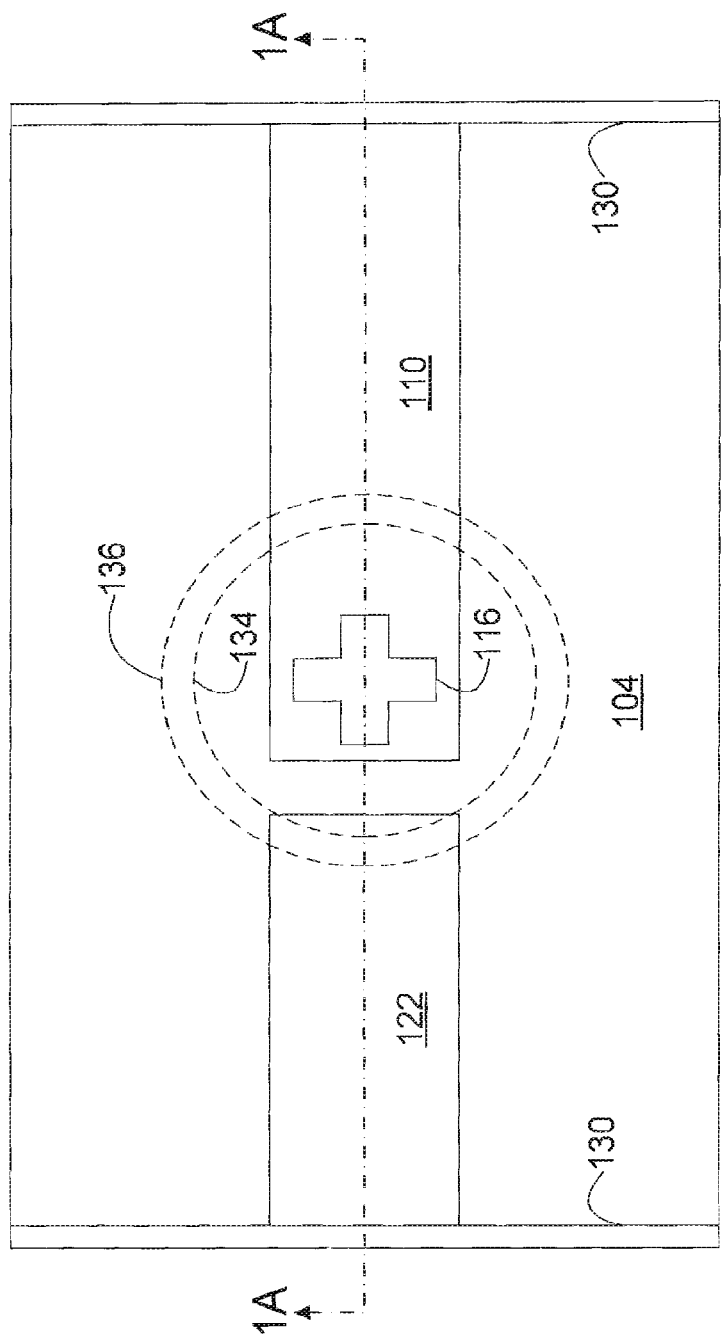
FIG. 1B is a cross-section top plan view of the electronic assembly of FIG. 1A.

FIG. 1B illustrates a cross-section top plan view of the electronic assembly of FIG. 1A. The cross-section is along the top surface of trace 110. A dashed-line circle 134 depicts the position of the smaller opening in the side of the first substrate 102 (the opening itself is not visible in the plane of the cross-section of FIG. 1A). Trace 110 includes an indentation 116. The shape of the indentation 116 is illustrated as a "plus sign" as an example of a shape of an indentation, but the actual shape is not important. The indentation 116 may be filled with an adhesive, and the light emitting device may be mounted over the indentation 116. The indentation may be an opening completely through the trace, so that the light emitting device is directly attached to the second substrate 104 in addition to being attached to the trace 110. Alternatively, the indentation may not be completely through the trace. The indentation provides an irregular three-dimensional surface (not flat) including side walls for improved adhesion. It is not necessary for the indentation 116 in the trace 110 to be completely enclosed by the trace 110. The indentation 116 just needs to provide an irregular shape for adhesion. In addition, the indentation may only partially expose the second substrate 104 so that the light emitting device 112 is directly attached to the second substrate 104 in addition to being attached to the trace 110. Attaching the light emitting device 112 to an irregular shape of an indentation, and/or directly to the surface of the second substrate 104, provides a more robust attachment (relative to attaching to a smooth flat metal surface), which reduces the likelihood of de-lamination.

In contrast to the prior art, the entire reflective cup in FIGS. 1A and 1B is not plated with a reflective material, so that at least a portion of the surface of the second substrate 104 may be exposed to the encapsulate 114. Allowing the encapsulate 114 to directly bond to the surface of the second substrate 104 provides a more robust attachment, which reduces the likelihood of de-lamination.

As an alternative to the encapsulate 114 directly bonding to the surface of the second substrate 104, the area surrounding the light emitting device 112 on the second substrate 104 may be printed or coated with a white or other light-colored high-temperature ink or solder mask to provide better reflectivity. Adhesion between the encapsulate and a substrate coated with ink or solder mask is still more robust than adhesion between an encapsulate and a smooth flat metal 'plating.

In FIG. 1A, the first substrate 102 may be attached to the second substrate 104 by using a bonding film 118. The bonding film 118 may be, for example, Prepreg (for example, R04400 Prepreg from Rogers Corporation, 100 S. Roosevelt Ave., Chandler, Ariz. 85226). The bonding film 118 may have a hole formed (for example, drilled, punched, or etched) before lamination, so that the hole in the film (depicted in FIG. 1B by a dashed-line circle 136) is slightly larger than the smaller opening of the hole 106 in the first substrate 102 (depicted in FIG. 1B by dashed-line circle 134). The resulting laminated structure will then have a recessed area 120, forming a gap between the first substrate 102 and the second substrate 104 around the opening in the bonding film 118. The encapsulate 114 may at least partially extend into the gap, creating an anchoring lock for the encapsulate, further preventing de-lamination.

In FIG. 1A, there may be a second trace 122 on the second substrate 104, and the light emitting device 112 may be electrically connected to the second trace 122 by a bonding wire, depicted by dashed line 124 in FIG. 1A. Alternatively, the first substrate 102 may have a trace 126, and the light emitting device 112 may be electrically connected to trace 126 by a bonding wire, depicted by dashed line 128 in FIG. 1A. The assembly 100 may be electrically connected to another assembly by, for example, solder pads 130. Traces 122 or 126, and trace 110, may be electrically connected to solder pads 130 by metal plating 132. Alternatively, traces 122 or 126, and trace 110, may be electrically connected to solder pads 130 by plated through-holes or vias, depicted by dashed lines 134 in FIG. 1A.

The indentation 116 in the trace 110 may have a metal bottom surface instead of an opening completely through the trace 110. For example, within the indentation 116, the second substrate 104 may be lightly plated (plated but not filling the indentation 116 to the top of the trace). Alternatively, the indentation 116 may be partially etched without etching all the way through the trace 110. For light emitting devices that generate a substantial amount of heat, a metal bottom surface in the indentation helps dissipate heat, perhaps at the expense of some adhesion, but adhesion to the irregular shape and walls of the indentation is better than adhesion to a smooth flat metalized surface.

The assembly 100 illustrated in FIGS. 1A and 1B may be a package comprising a single light emitting device. Alternatively, the assembly 100 may be one element of a larger assembly having a plurality of light emitting assemblies, or one element of an array of light emitting assemblies.

Figure 2A:
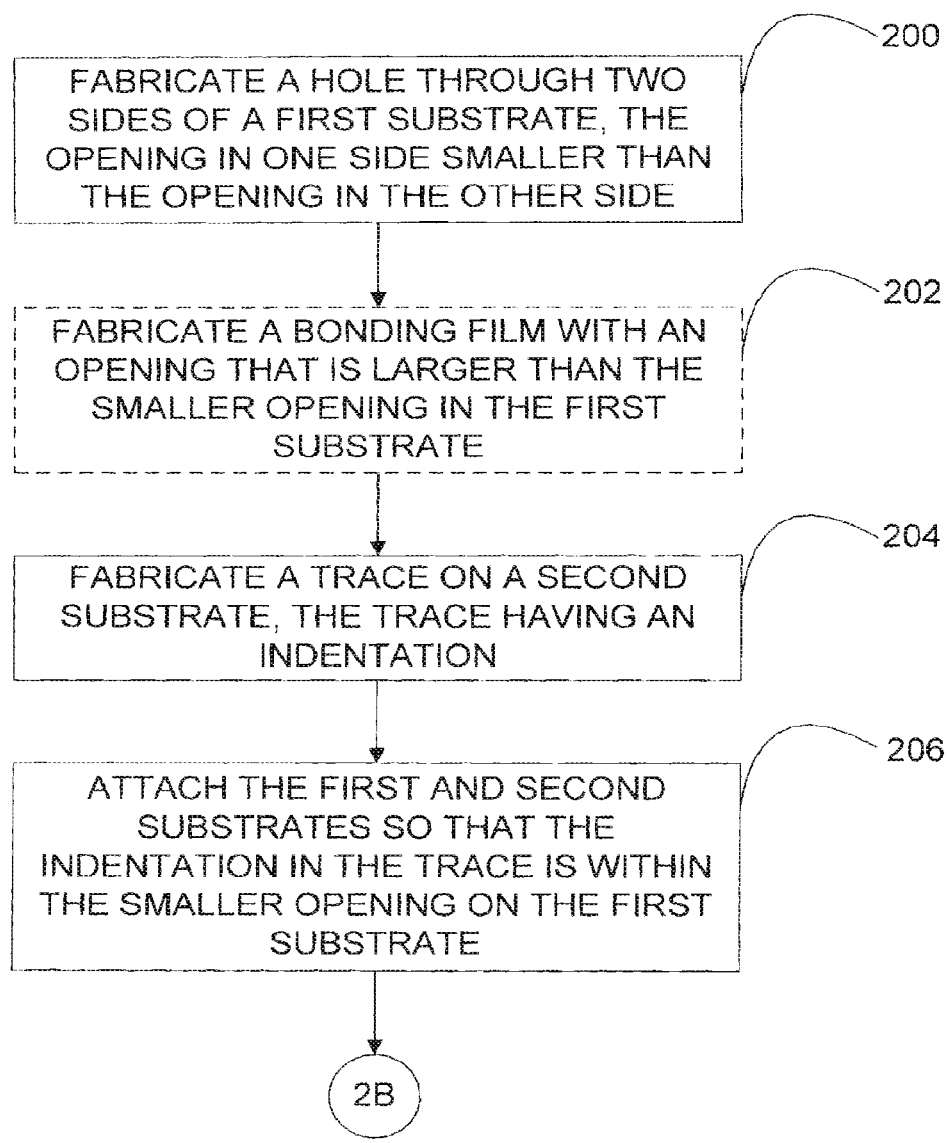
FIG. 2A is a flow chart illustrating an example method of manufacturing an electronic assembly.
Figure 2B:
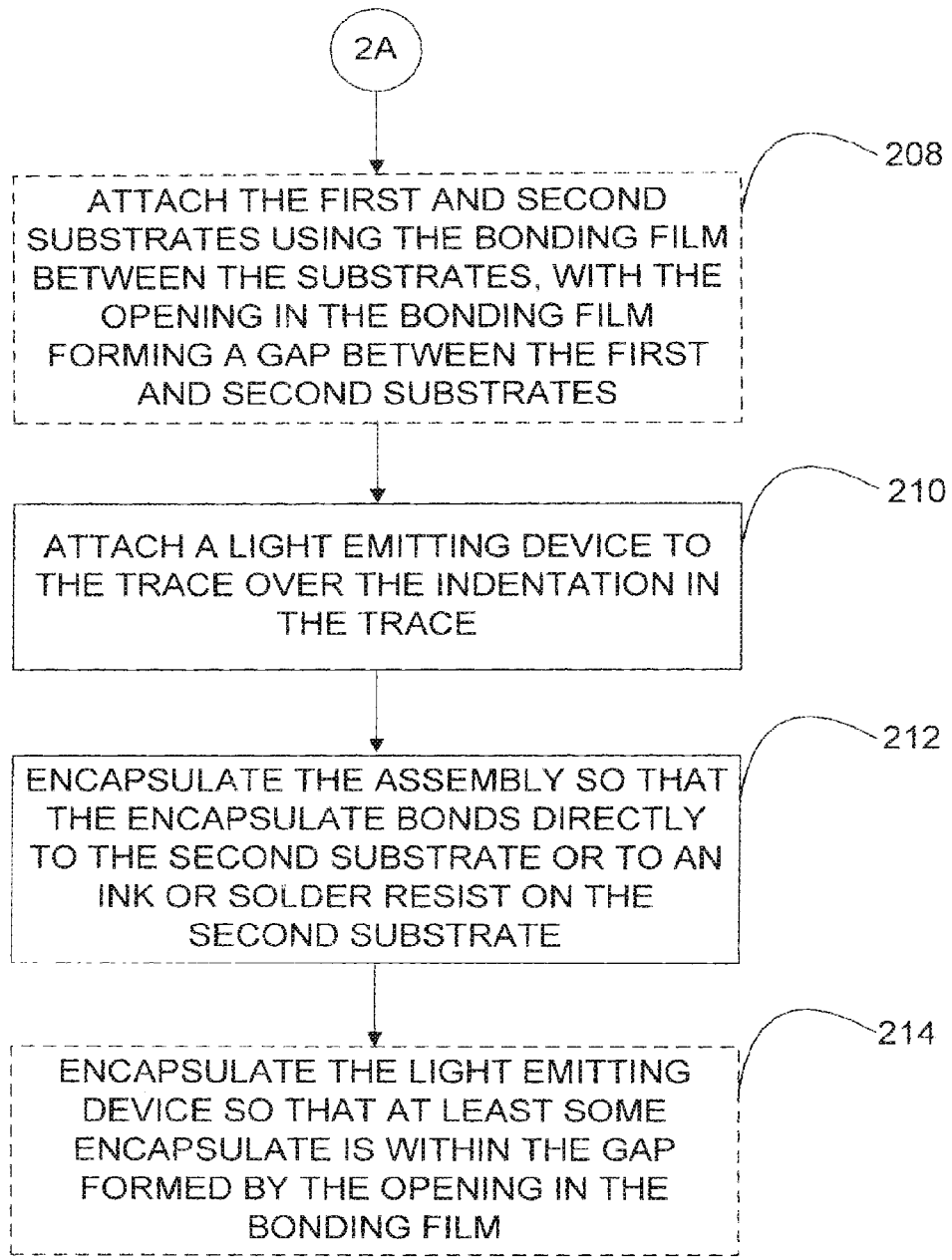
FIG. 2B is a continuation of the flow chart of FIG. 2A.

FIG. 2A illustrates an example method of making an electronic assembly as depicted in FIGS. 1A and 1B. Note, the order of the steps as illustrated in FIGS. 2A and 2B does not imply a required order, and some steps may be performed simultaneously or may be performed in other sequences. In addition, not all of the illustrated steps are required, and in particular, the designation of a step as optional or alternative does not imply that steps not so designated are required. At step 200, a hole is fabricated through two sides of a first substrate (for example, by drilling), where an opening in one side is smaller than the opening in the other side. At alternative step 202, a bonding film is fabricated with an opening that is larger than the smaller opening in the first substrate. At step 204, a trace is fabricated on a second substrate, the trace having an indentation (or opening). At step 206, the two substrates are attached so that the indentation in the trace is within the smaller opening on the first substrate. In FIG. 2B, at alternative step 208, the two substrates are attached using the bonding film between the two substrates, with the opening in the bonding film forming a gap between the two substrates. At step 210, a light emitting device is attached to the trace over the indentation in the trace. At step 212, the assembly is encapsulated such that at least some encapsulate directly bonds with the second substrate, or to an ink or solder resist on the second substrate. At alternative step 214, encapsulation results in at least some encapsulate within the gap formed by the opening in the bonding film.

As discussed above, the disclosed light emitting device assembly provides at least three improvements to decrease de-lamination: (1) attaching the light emitting device to an irregular surface such as an indentation (or opening) in a trace, and/or attaching the light emitting device directly to the second substrate; (2) bonding the encapsulate directly to the second substrate (or to a substrate coated with an ink or solder mask); and (3) providing a recessed anchoring lock (gap between substrates) for the encapsulate. The improvements may be implemented individually, or in any combination.

What is claimed is:

1. An electronic assembly, comprising:
a first substrate having a hole;
a second substrate, the first substrate attached to the second substrate;
a first trace on an upper surface of the second substrate, the first trace having an indentation defining an opening that does not penetrate into the upper surface of the second substrate and is completely enclosed by the first trace;
a light emitting device attached to the first trace at the indentation in the first trace; and,
the light emitting device positioned within the hole in the first substrate.

2. The electronic assembly of claim 1, the indentation comprising an opening through the first trace, the light emitting device attached to the second substrate through the opening in the first trace.

3. The electronic assembly of claim 1, further comprising a second trace on the second substrate, the light emitting device electrically connected to the second trace.

4. The electronic assembly of claim 1, further comprising a second trace on the first substrate, the light emitting device electrically connected to the second trace on the first substrate.

5. The electronic assembly of claim 1, the light emitting device comprising a Light Emitting Diode.

6. The electronic assembly of claim 1, further comprising an encapsulate, the encapsulate directly bonded to at least a portion of the second substrate.

7. The electronic assembly of claim 1, further comprising:
the first substrate having a reflective coating; and,
an encapsulate, the encapsulate bonded to the reflective coating.

8. The electronic assembly of claim 1, further comprising:
a bonding film between the first and second substrates, the bonding film having an opening that is larger than the hole in the first substrate, the bonding film positioned so that a gap is formed between the first and second substrates within the opening in the bonding film; and, an encapsulate, the encapsulate at least partially within the gap.

9. An electronic assembly, comprising:
a first substrate, a hole through the first substrate;
a second substrate;
a first trace on the second substrate, the first trace having an indentation completely enclosed by the first trace;
a bonding film between the first and second substrates, the bonding film having an opening, the bonding film positioned so a gap is formed between the first and second substrates within the opening in the bonding film;
an electronic device mounted on the second substrate within the hole though the first substrate and attached to the indentation with an adhesive; and,
an encapsulate, encapsulating the electronic device, the encapsulate at least partially extending into the gap between the first and second substrates.

10. The electronic assembly of claim 9, further comprising a second trace on the second substrate, the light emitting device electrically connected to the second trace.

11. The electronic assembly of claim 9, further comprising a second trace on the first substrate, the light emitting device electrically connected to the second trace on the first substrate.

12. The electronic assembly of claim 9, the light emitting device comprising a Light Emitting Diode.

13. The electronic assembly of claim 9, further comprising an encapsulate, the encapsulate directly bonded to at least a portion of the second substrate.

14. The electronic assembly of claim 9, further comprising:
the second substrate having a reflective coating; and,
an encapsulate, the encapsulate bonded to the reflective coating.

15. The electronic assembly of claim 9, further comprising:
a bonding film between the first and second substrates, the bonding film having an opening that is larger than the hole in the first substrate, the bonding film positioned so that a gap is formed between the first and second substrates around the opening in the bonding film; and,
an encapsulate, the encapsulate at least partially within the gap.

16. A method of making an electronic assembly, comprising:
fabricating a hole through two sides of a first substrate, a first opening of the hole in one side is smaller than a second opening of the hole in the other side;
fabricating a first trace on an upper surface of a second substrate, the first trace having an indentation defining an opening that does not penetrate into upper surface of the second substrate an is completely enclosed by the first trace;
attaching the first and second substrates so that the indentation in the first trace is within the smaller opening on the first substrate; and,
attaching an electronic device to the indentation in the first trace.

17. The method of claim 16, further comprising:
fabricating a bonding film with a third opening that is larger than the first opening of the first substrate; and,
attaching the first and second substrates using the bonding film between the two substrates, with the electronic device within the third opening in the bonding film, and with the third opening in the bonding film forming a gap between the first and second substrates within the third opening in the bonding film.

18. The method of claim 17, further comprising encapsulating the electronic assembly so that at least some of the encapsulate is within the gap.

19. The method of claim 16, further comprising: encapsulating the electronic assembly so that the encapsulate directly bonds with at least a portion of the second substrate.

20. The method of claim 16, further comprising:
coating at least a portion of the first substrate with a reflective coating; and,
encapsulating the electronic assembly so that the encapsulate bonds with the reflective coating on the first substrate.

* * * * *